US008183884B2

(12) United States Patent
Jung

(10) Patent No.: US 8,183,884 B2
(45) Date of Patent: May 22, 2012

(54) OUTPUT DRIVING DEVICE IN SEMICONDUCTOR DEVICE

(75) Inventor: Dong-Il Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/387,700

(22) Filed: May 6, 2009

(65) Prior Publication Data
US 2010/0013525 A1   Jan. 21, 2010

(30) Foreign Application Priority Data

Jul. 21, 2008   (KR) .................. 10-2008-0070565

(51) Int. Cl.
*H03K 19/0175*   (2006.01)
(52) U.S. Cl. ............... 326/82; 326/33; 326/58; 326/81; 326/87; 327/109; 327/112; 327/333
(58) Field of Classification Search .............. 326/56–58, 326/62, 21, 31, 33–34, 63, 80–87; 327/108–109, 327/112, 333
See application file for complete search history.

(56) References Cited

U.S. PATENT DOCUMENTS

| 5,128,563 A * | 7/1992 | Hush et al. ............... 326/87 |
| 5,274,276 A * | 12/1993 | Casper et al. ............ 326/21 |
| 5,369,317 A * | 11/1994 | Casper et al. ............ 326/87 |
| 5,519,340 A * | 5/1996 | Rybicki et al. ........... 326/88 |
| 5,680,071 A * | 10/1997 | Senoh et al. ............. 327/390 |
| 5,917,348 A * | 6/1999 | Chow ..................... 327/108 |
| 6,121,795 A * | 9/2000 | Curd et al. .............. 326/83 |
| 6,720,802 B2 | 4/2004 | Cho |
| 7,005,897 B2 | 2/2006 | Lim |
| 7,456,663 B2 | 11/2008 | Lim |
| 7,633,321 B2 * | 12/2009 | Hebenstreit ............ 327/108 |
| 2003/0107414 A1 | 6/2003 | Cho |
| 2004/0239382 A1 | 12/2004 | Lim |
| 2006/0197560 A1 | 9/2006 | Lim |

FOREIGN PATENT DOCUMENTS

| JP | 11-168373 | 6/1999 |
| KR | 2003-0047035 | 6/2003 |
| KR | 10-2004-0102608 | 12/2004 |

* cited by examiner

*Primary Examiner* — Jason M Crawford
(74) *Attorney, Agent, or Firm* — Onello & Melllo, LLP

(57) ABSTRACT

An output driving device prevents an inflow of external current through an output terminal even when there is no power supply. The output driving device includes an output circuit that maintains an output terminal at a low impedance state by receiving a supply of power in an output drive operation and maintains the output terminal at a high impedance state by receiving the supply of power in a non-output drive operation and a leakage prevention unit coupled to the output terminal of the output circuit, the leakage prevention unit preventing a current inflow to the output circuit through the output terminal when the supply of power is not supplied to the output circuit.

11 Claims, 8 Drawing Sheets

OUTPUT DRIVING DEVICE IN SEMICONDUCTOR DEVICE

CROSS-REFERENCE TO RELATED APPLICATIONS

This application claims the benefit under 35 U.S.C. 119 from Korean Patent Application 10-2008-0070565, filed on Jul. 21, 2008, the contents of which are hereby incorporated by reference in their entirety as if fully set forth herein.

BACKGROUND

An electronic processing device or semiconductor device generally has an output driving device that drives the output of data. Such an output driving device is adapted to maintain a high impedance state in a non-output drive operation by receiving a supply of power, but it is difficult for the output terminal of the device to maintain the high impedance state when there is no supply of power to the device. Thus, an external current may flow in through the output terminal. It is therefore proposed to introduce an improved technology that maintains the output terminal in the high impedance state even when there is no supply of power to the device.

SUMMARY

The present invention relates to an output driving device for use in a semiconductor device, wherein the output driving device is capable of preventing an inflow of external current through an output terminal even without a supply of power.

Accordingly, some embodiments of the invention provide an output driving device for use in a semiconductor device. When there is no supply of power to a device, a leakage current path is not formed in the inside of the device. Even when there is no supply of power, an inflow of external current through an output terminal can be prevented.

Some embodiments of the invention provide an electronic processing device and a method of preventing an inflow current through an output terminal, in which a current path is not formed even when a power supply is cut off and the output terminal is driven by an external connection device.

In accordance with an aspect of the invention, an output driving device comprises an output circuit that maintains an output terminal at a low impedance state by receiving a supply of power in an output drive operation and that maintains the output terminal at a high impedance state by receiving the supply of power in a non-output drive operation; and a leakage prevention unit coupled to the output terminal of the output circuit, the leakage prevention unit preventing a current inflow to the output circuit through the output terminal when the supply of power is not supplied to the output circuit.

In an embodiment, the output circuit comprises a first conductive Metal Oxide Semiconductor (MOS) transistor comprising a source terminal, a drain terminal coupled to the output terminal, and a gate terminal, wherein the MOS transistor provides or cuts off the supply of power that is applied to the source terminal to the output terminal according to a logic state of the gate terminal in the output drive operation, and maintains the gate terminal at a level of the supply of power in the non-output drive operation; and a second conductive MOS transistor comprising a source terminal, a drain terminal, and a gate terminal, wherein the drain terminal is coupled to the output terminal, wherein the source terminal is coupled to a ground voltage, wherein a voltage level of the drain terminal is maintained intact or changed to a level of the ground voltage according to a logic state of the gate terminal in the output drive operation, and wherein the gate terminal is maintained at a level of the ground voltage in the non-output drive operation.

In an embodiment, the leakage prevention unit comprises a switching transistor that is coupled between the drain terminal of the first conductive MOS transistor and the output terminal, that transfers a drain output voltage of the first conductive MOS transistor to the output terminal without a level change in the output drive operation, and that prevents an external current from being applied to the drain terminal of the first conductive MOS transistor through the output terminal when the supply of power is not supplied to the output circuit.

In an embodiment, a high voltage generator applies a voltage having a level that is higher than a voltage level of the supply of power to a gate terminal of the switching transistor in the output drive operation, and that applies a voltage to completely turn off the switching transistor to the gate terminal of the switching transistor when the supply voltage is not supplied to the output circuit.

In an embodiment, when the first conductive MOS transistor is a p-type MOS transistor, the second conductive MOS transistor is an n-type MOS transistor.

In an embodiment, the switching transistor comprises an n-type MOS transistor.

In an embodiment, the output driving device is applied to a universal serial bus (USB) system.

In accordance with another aspect of the invention, an output driving device comprises a pull-up transistor that receives a supply of power and then drives an output of data in response to the supply of power; a pull-down transistor having a drain-source channel that is coupled to an output terminal that in turn is coupled to a drain terminal of the pull-up transistor; and a current path blocking unit coupled between the pull-up and pull-down transistors, the current path blocking unit functioning as a wiring line when at least one of the pull-up and pull-down transistor operates, and blocking an inflow of external current to the drain terminal of the pull-up transistor even when the inflow of the external current to the output terminal occurs in a state in which when the supply of power is not applied to the pull-up transistor.

In an embodiment, the current path blocking unit comprises a switching transistor having a channel that is coupled between channels of the pull-up transistor and the pull-down transistor; and a high voltage generator that applies a voltage having a level higher than that of the supply of power to a gate terminal of the switching transistor when the supply of power is applied, and applies to the gate terminal a voltage to produce a condition under which the switching transistor is turned off even when external power is applied to the output terminal in a state when the supply of power is not applied.

In an embodiment, the high voltage generator includes a step-up converter using a voltage doubler.

In an embodiment, the supply of power is obtained from a regulator.

In an embodiment, the voltage doubler receives the supply of power as input power and generates a voltage twice that of the supply of power.

In an embodiment, the voltage doubler receives as input power a voltage that is lower than that of the supply of power and generates a voltage having a level lower than twice that of the supply of power.

In accordance with another aspect of the invention, an electronic processing device including a regulator comprises a pull-up transistor that receives a supply of power applied from the regulator and drives an output of data in response to the supply of power; a pull-down transistor having a drain-source channel that is coupled to an output terminal that in turn is coupled to a drain terminal of the pull-up transistor; and a current path blocking unit functioning as a connection line for an electrical connection between the output terminal and the drain terminal of the pull-up transistor when the pull-up or pull-down transistor operates, and maintaining a high impedance state to block an inflow of current to the device when an external electrical signal is applied to the output terminal in a state when the supply of power is not applied to the pull-up transistor.

In an embodiment, the current path blocking unit comprises a switching transistor having a channel that is coupled between channels of the pull-up transistor and the pull-down transistor; and a high voltage generator that applies a high voltage having a level higher than that of the supply of power to a gate terminal of the switching transistor when the supply of power is applied and applies to the gate terminal a voltage to produce a condition that the switching transistor is turned off even when external power is applied to the output terminal in a state when the supply power is not applied.

In accordance with another aspect of the invention, a data output driving device including an output circuit having pull-up and pull-down transistors comprising channels that are coupled in series to each other comprises a regulator that receives an operating power and generates a regulated voltage as a supply of power; a pull-up driver coupled to a gate terminal of the pull-up transistor; a pull-down driver coupled to a gate terminal of the pull-down transistor; a high voltage generator that receives the supply of power and generates a high voltage having a level that is higher than that of the supply of power; and a switching transistor to connect a pull-up voltage appearing in a drain terminal of the pull-up transistor to an output terminal without a voltage drop in response to the high voltage, and to block an inflow of an external electrical signal to the pull-up transistor when the external electrical signal is applied to the output terminal.

In an embodiment, the data output driving device is an output driving device of a USB system.

In an embodiment, the high voltage generator applies a voltage lower than twice that of the supply of power to the gate terminal of the switching transistor when the supply power exists, and applies a ground voltage to the gate terminal when the supply of power does not exist.

In accordance with another aspect of the invention, a method of blocking an inflow of current into an output terminal in a data output driving device including pull-up and pull-down transistors having channels that are coupled in series to each other comprises installing a unidirectional switching device between the pull-up transistor and the output terminal; and maintaining the unidirectional switching device at a switching-on state without a loss of electricity when the data output driving device is in an operating mode, and maintaining the unidirectional switching device at a switching off state when a supply of power is not applied to the data output driving device, so as to block an electrical signal from flowing into an interior of the device from the output terminal.

In an embodiment, the unidirectional switching device is constructed of an n-type MOS transistor having an operation of compensating for a threshold voltage drop.

In accordance with embodiments of the invention, a high impedance state can be kept even when there is not a supply of power and thus an output terminal is driven by other external devices, thereby preventing a leakage current path from being formed inside the device.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF THE EMBODIMENTS

Figure 1:
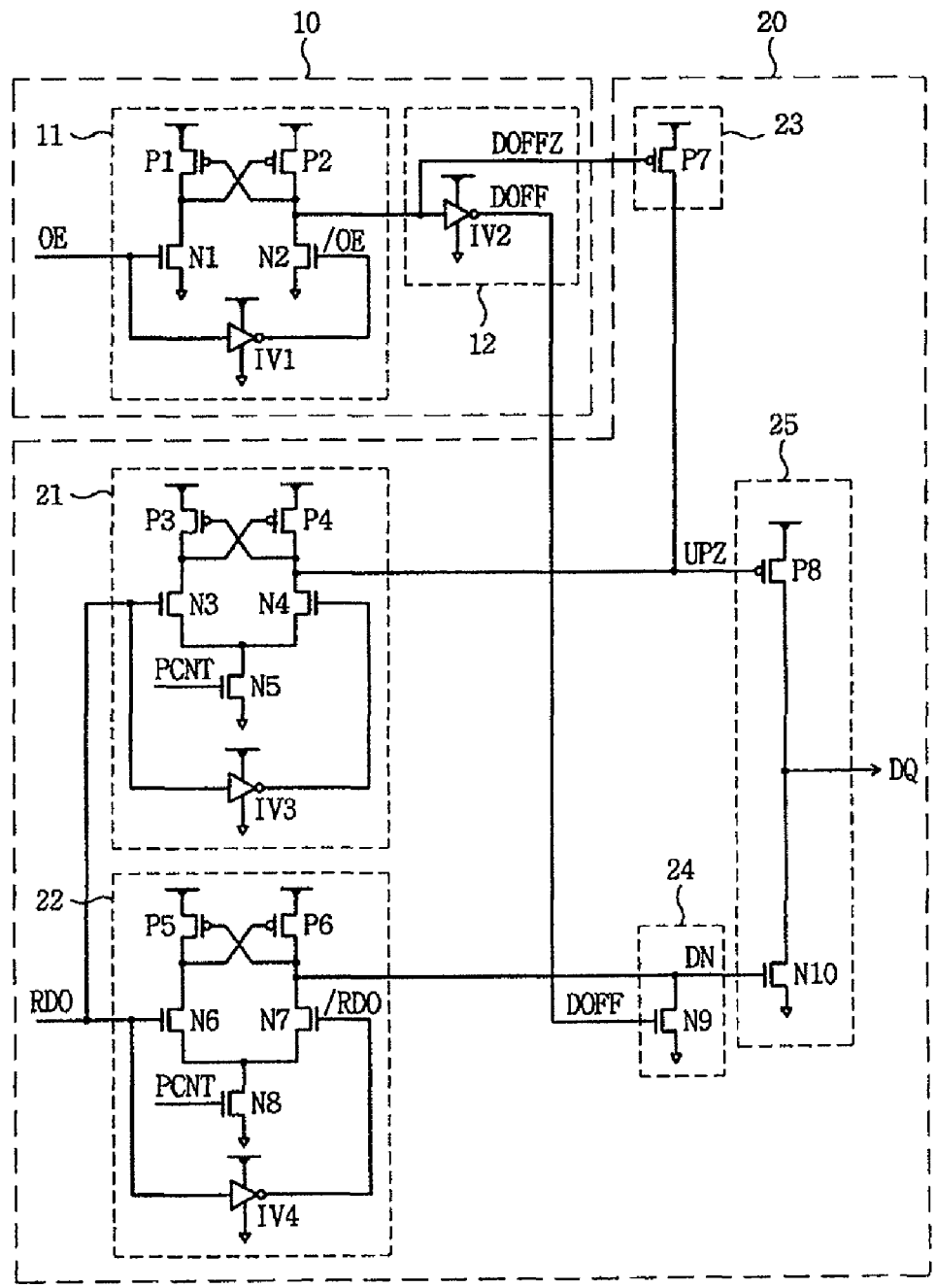
FIG. 1 is a circuit diagram of a general output driving device for use in a semiconductor memory device.

Hereinafter, exemplary embodiments the inventive concept will be described in detail by explaining exemplary embodiments of the invention with reference to the attached drawings, from which the inventive concepts will be evident to those skilled in the art. Like reference numerals in the drawings denote like elements.

Accordingly, well-known function circuits related to a high impedance state and pull-up and pull-down operations are not described in detail herein for certain embodiments of the invention.

Unless otherwise defined, all terms (including technical and scientific terms) used herein have the same meaning as commonly understood by one skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. are being used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

An output driving device that prevents an inflow of external current through an output terminal even when there is no supply of power is described as follows, according to embodiments of the invention.

For a more thorough understanding of functions and operations in embodiments of the invention, formation of a leakage current path when no supply of power is provided will first be described with reference to FIGS. 1 to 6.

Figure 2:
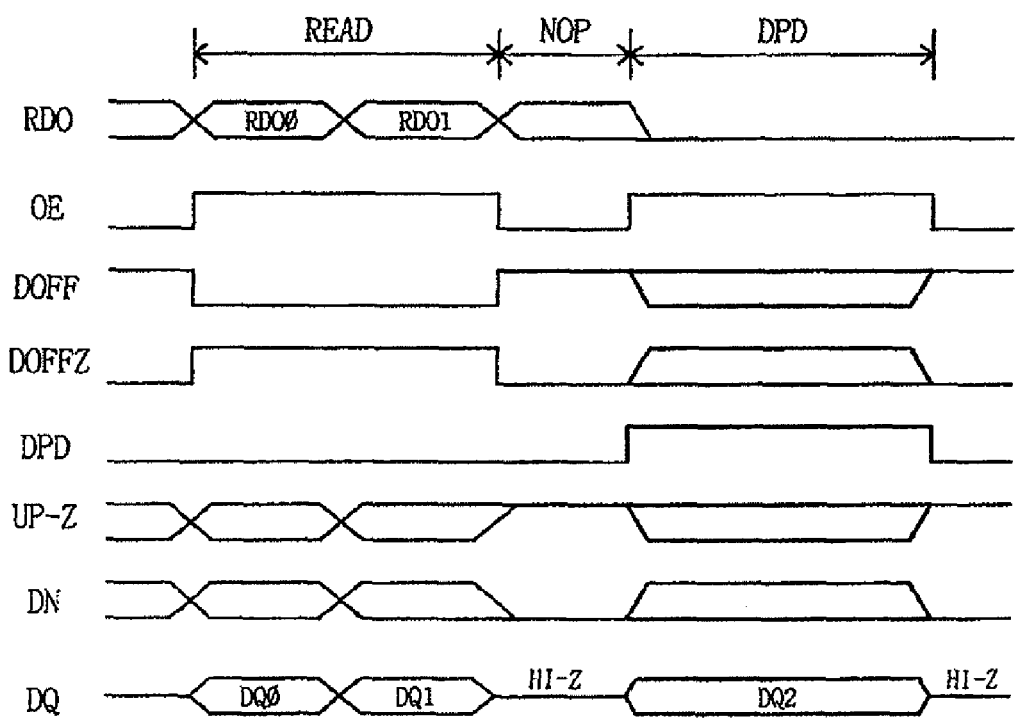
FIG. 2 is a set of timing diagrams illustrating the operation of the device of FIG. 1.

FIG. 1 is a circuit diagram of a general output driving device for use in a semiconductor memory device. FIG. 2 is a set of timing diagrams illustrating the operation of the device of FIG. 1.

With reference to FIG. 1, an output driving device of a semiconductor memory device comprises a data output driver 20 and a driver controller 10 and can be adapted to function as a data output buffer. The driver controller 10 comprises a first level shifter 11 and a first output controller 12, and the data output driver 20 comprises a second level shifter 21, a third level shifter 22, a first pull-down controller 23, a first pull-down controller 24, and a first output driver 25. The second level shifter 21 and the third level shifter 22 are enabled in response to a pipe counter signal PCNT so as to shift a level of a data signal RDO from a memory cell.

As shown in FIG. 2, in a first operation in which a read command READ is input to the device, an output enable signal OE is input to the first level shifter 11 of the driver controller 10 as a high level signal, and the first level shifter 11 outputs a high level signal, that is, an output control signal DOFFZ. A first output controller 12 of the driver controller comprises an inverter IV2 that inverts the output control signal DOFFZ and outputs an output control signal DOFF as a low level signal. At this time, the data signal RDO from a memory cell is provided to a data output terminal of the data output driver 20. Then, in a second operation NOP in which any read command READ is not input to the device, the output control signal DOFF becomes a high level signal, and an output of the first output driver 25 enters a high impedance state HI-Z.

Subsequently, when entering a deep power down mode DPD in a third operation to reduce power consumption, the supply of all internal power voltages is stopped inside the semiconductor memory device. At this time, the level of output control signal DOFF and output control signal DOFFZ, which control an output of the data output driver 20, may create instability in the device. Thus, a pull-up signal UPZ and a pull-down signal DN of a first pull-up controller 23 and a first pull-down controller 24, respectively, of the data output driver 20 cannot be maintained in a stabilized level state. Here, when external power is supplied to the data output driver 20, the pull-up signal UPZ enters a low level state and thus a PMOS transistor P8 of the first output driver 25 is turned ON (case1). Thus, the output data is at a high level. Also, when the pull-down signal DN becomes high, an NMOS transistor N10 of the first output driver 25 is turned ON (case2). Thus, the output data is at a low level. Further, when the pull-up signal UPZ transitions to a logic low level and the pull-down signal DN transitions to a logic high level, the PMOS transistor P8 and the NMOS transistor N10 are each turned ON (case3). Thus, due to the absence of external power in the deep power down mode DPD, a current path is formed through the output terminal DQ of the output driver 25, which can affect the high impedance state of the output terminal DQ. On the other hand, when internal power voltages are used in the data output driver 20, a current path is formed through a data bus line, and each of the PMOS transistor P8 and NMOS transistor N10 for the abovementioned cases 1 and 2. Furthermore, for the abovementioned case 3, a current path is formed between a data bus line and an internal power voltage source.

Consequently, in the deep power down mode, output data must be maintained in a high impedance state. However, the output data cannot maintain the high impedance state because of the formation of the current path, but is instead generated in an unreliable state to the output terminal. As a result, a data contention problem occurs in the data bus line. Further, unnecessary current consumption can occur.

Figure 3:
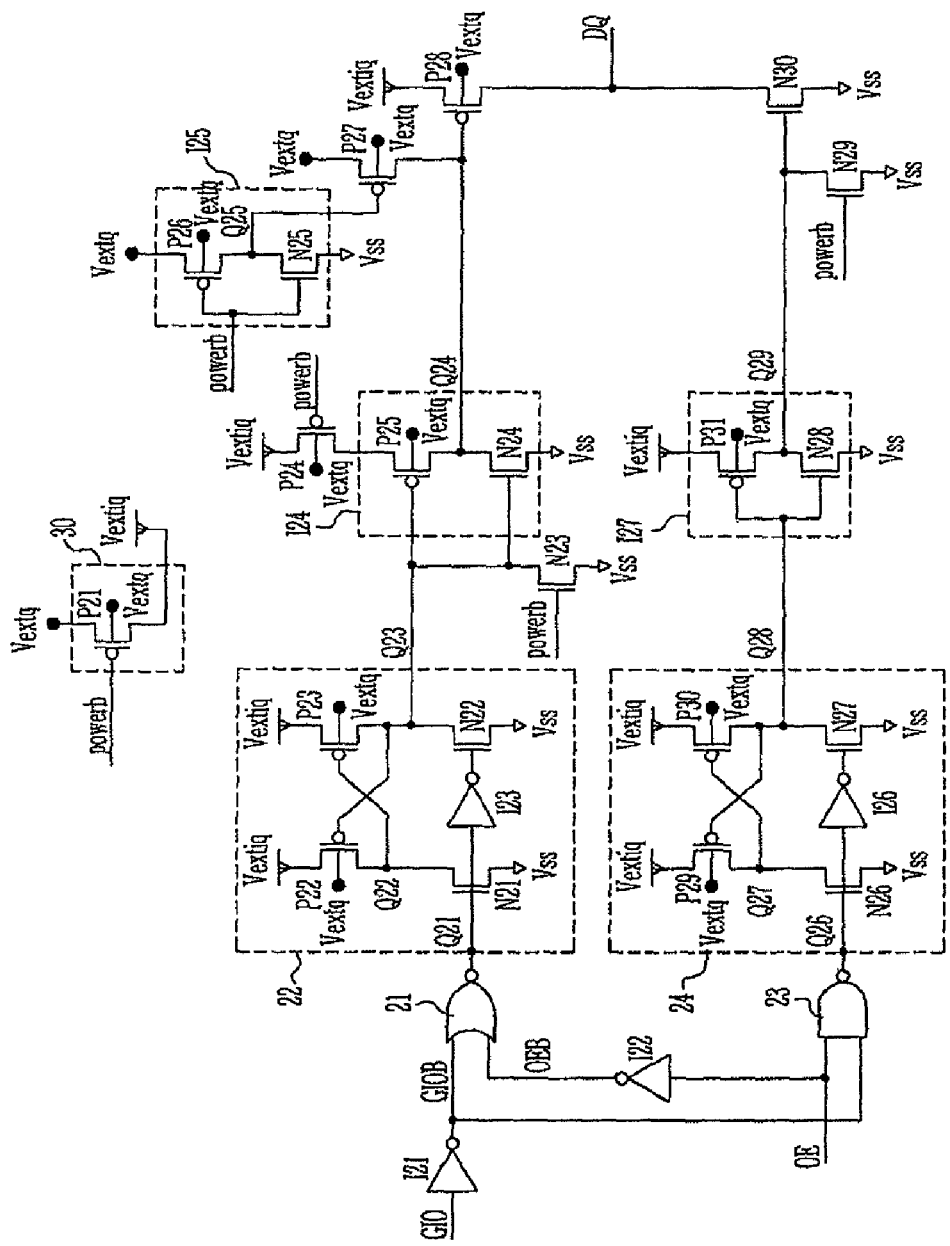
FIG. 3 is a circuit diagram of another general output driving device.

On the other hand, FIG. 3 is a circuit diagram of another general output driving device, similar to the driving device described herein with regard to FIG. 1, except that the output driving device of FIG. 3 comprises an output circuit that may be applied to a semiconductor device such as SRAM, which is capable of preventing current consumption by preventing a signal from being externally applied to the interior of the device through an output terminal DQ in the deep power down mode of the semiconductor device. In particular, when a power bar signal (powerb) is applied as a high state in the deep power down mode, PMOS transistor P28 and NMOS transistor N30 of FIG. 3 enter states that permit the output terminal DQ to enter a high impedance state. Thus, in FIG. 3, an electrical signal is not applied from the outside into the interior through the output terminal DQ of the output circuit.

More specifically, when a power bar signal (powerb) is applied as a high state signal in the deep power down mode DPD, a first PMOS transistor P21 of a power source 30 is turned off and a first external power Vextiq is not supplied as a second external power Vextiq to the output circuit. Thus, first and second level shifters 22 and 24 enter a floating state. A third NMOS transistor N23 is turned on and a third node Q23 is maintained at a low state. A fourth PMOS transistor P24 is turned off and a second external power Vextiq is not supplied. Thus, a fourth inverter I24 does not operate and a fourth node Q24 enters a floating state. At this time, the power bar signal (powerb) applied as a high state signal is inverted to a low state through a fifth inverter I25 and a fifth node Q25 is maintained at a low state. A seventh PMOS transistor P27 is turned on by a potential of the fifth node Q25 maintaining a low state, and the first external power Vextq is supplied to the fourth node Q24. Thus, the fourth node Q24 is maintained at a high state, and an eighth transistor P28 is turned off.

Further, a ninth NMOS transistor N29 is turned on by the power bar signal (powerb) applied at a high state. Thus, a ninth node Q29 is maintained as a low state, and a tenth NMOS transistor N30 is turned off. Therefore, output terminal DQ is not maintained in a high impedance state.

Output driving devices applied to general electronic processing devices will be described as follows with reference to FIGS. 4 and 5.

Figure 4:
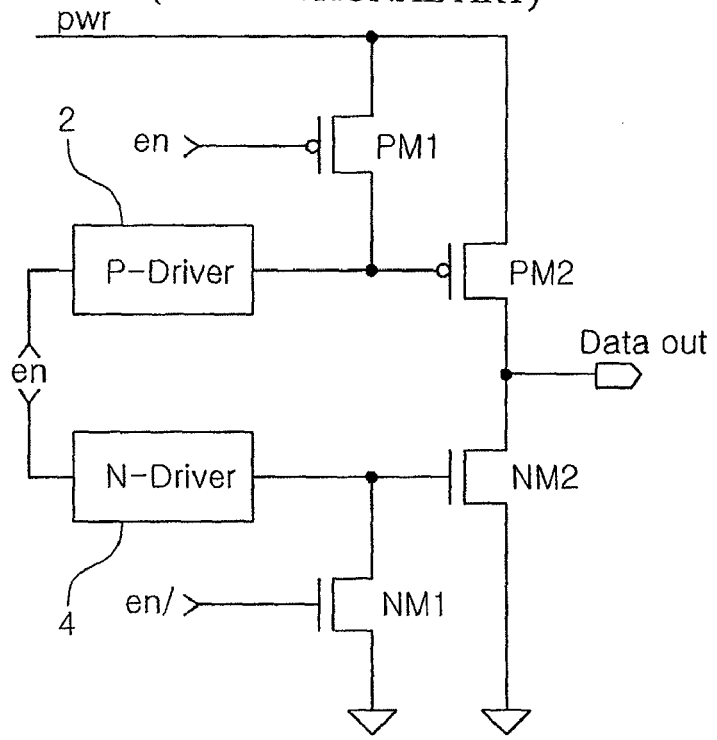
FIGS. 4 and 5 are circuit diagrams of general output driving devices for use in electrical processing devices.

Referring first to FIG. 4, an output driving device comprises a PMOS transistor PM2 coupled to a pull-up driver 2, an NMOS transistor NM2 coupled to a pull-down driver 4, and disable transistors PM1 and NM1.

In an output drive operation, an enable signal (en) is applied at a logic high level to transistor PM1 and an inverted enable signal (en/) is applied at a low logic level to transistor NM1, wherein the disable transistors PM1 and NM1 are turned off, and a data output terminal (Data out) is maintained at a low impedance state. When an output of the pull-up and pull-down drivers 2 and 4 has a logic low level, an output of the data output terminal (Data out) is provided in a logic high state, and when an output of the pull-up and pull-down drivers 2 and 4 has a logic high level, an output of the data output terminal (Data out) is provided in a logic low state.

In a non-output drive operation, the enable signal (en) is applied as a logic low level. Thus, the disable transistors PM1 and NM1 are turned on, and the output of the pull-up and pull-down drivers 2 and 4 becomes disabled. In this case, an output of the data output terminal (Data out) is maintained at a high impedance state.

However, in a state when a supply of power (pwr) is not applied to the circuit of FIG. 4, an electrical signal may appear at the data output terminal (Data out), which may lead to a condition whereby the PMOS transistor PM2 is turned on or activated, resulting in a leakage current that flows through the PMOS transistor PM2 into the internal circuit.

Figure 5:
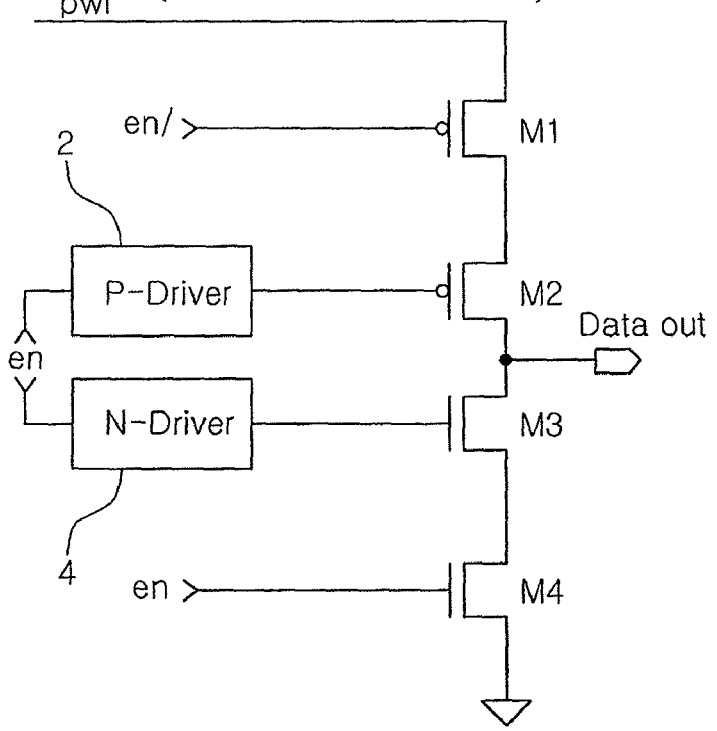

Referring to FIG. 5, a circuit is illustrated having four MOS transistors M1, M2, M3 and M4 coupled in series to one another, a pull-up driver 2 coupled to the PMOS transistor M2, and a pull-down driver 4 coupled to the NMOS transistor M3. The MOS transistors M1 and M4 function as disable transistors.

In an output drive operation, an enable signal (en) is applied at a logic high level. Then, disable transistors M1 and M4 are turned on, and data output terminal (Data out) is maintained at a low impedance state. When an output of the pull-up and pull-down driver 2 and 4 has a logic low state, an output of the data output terminal (Data out) is output at a logic high level, and when an output of the pull-up and pull-down drivers 2 and 4 has a logic high level, an output of the data output terminal (Data out) is output at a logic low level.

In a non-output drive operation, the enable signal (en) is applied as a logic low level. Thus, the disable transistors M1 and M4 are all turned off, and the output of the pull-up and pull-down drivers 2 and 4 becomes disabled. In this case, an output of the data output terminal (Data out) is maintained in a high impedance state.

However, in a state when a supply of power (pwr) is not applied to the circuit of FIG. 5, an electrical signal may appear at the data output terminal (Data out), which may lead to a condition of turning on the PMOS transistor M2, resulting in a leakage current that flows through the PMOS transistor M2 into the internal circuit. This undesirable effect is described in greater detail with reference to FIG. 6.

Figure 6:
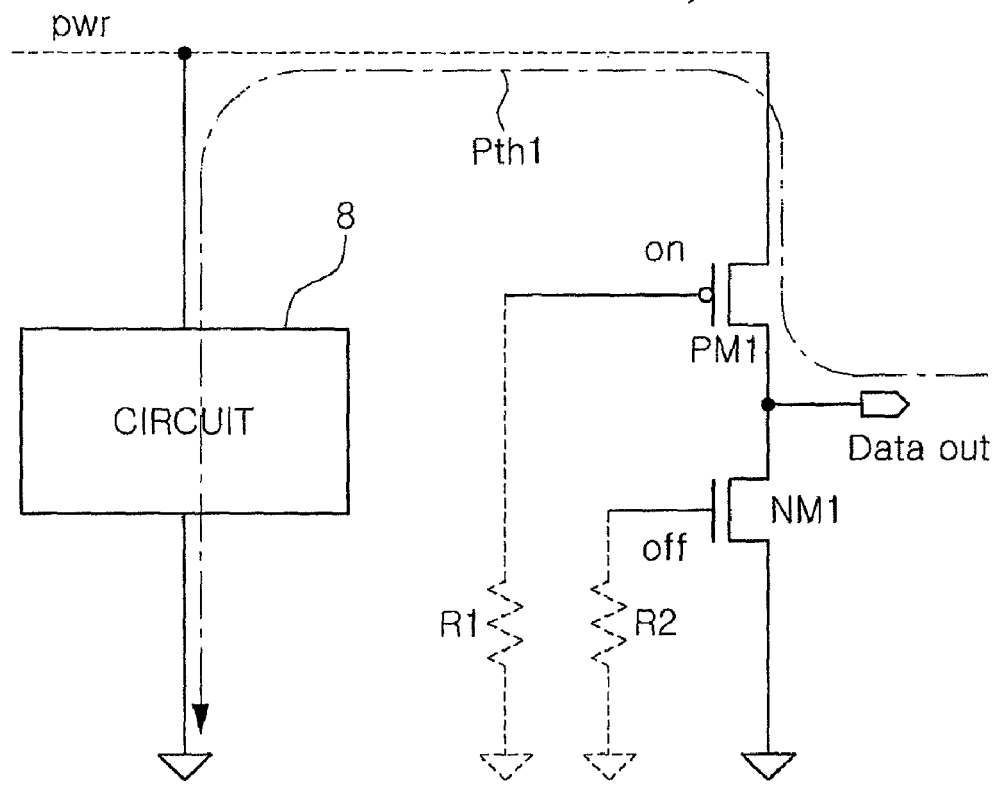
FIG. 6 is a diagram illustrating an undesirable leakage current that flows through an internal circuit.

FIG. 6 is a diagram illustrating an undesirable leakage current that flows through an internal circuit. As described above with regard to FIGS. 4 and 5, an output terminal (Data out) is maintained in a high impedance state when a power source is applied to the device. However, when an electrical signal is applied to the output terminal in a state during which a power source does not apply power to the device, a current path Pth1 coupled to a ground of the internal circuit device 8 from the output terminal (Data out) is formed and a leakage current flows through the current path Pth1. Subsequently, when such a current path is formed through an internal device from the output terminal, and thus causing a leakage current to occur, damage to the device or the influence of noise is inevitable. Thus, an enhanced technology for a solution to such problems is required.

A solution to a leakage current generation problem referred to in FIG. 6 is described as follows, referring to FIGS. 7 to 10.

Figure 7:
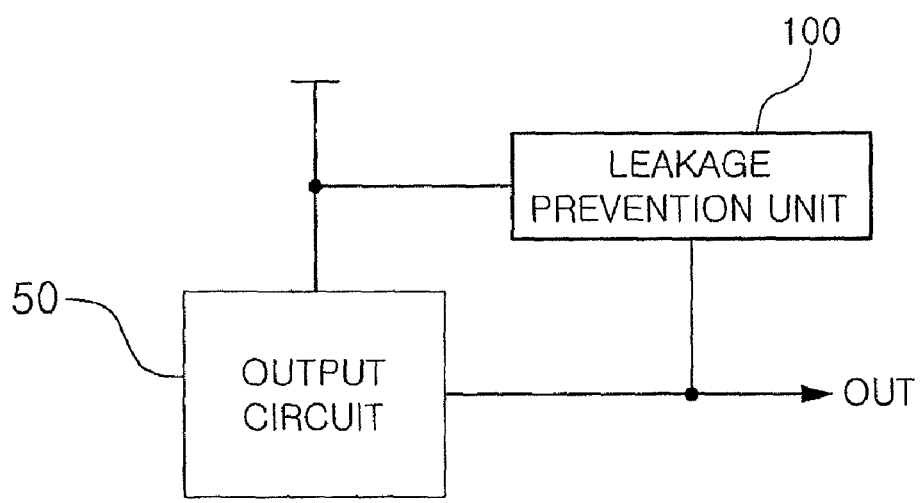
FIG. 7 is a block diagram of an output driving device according to an embodiment of the invention.

FIG. 7 is a block diagram of an output driving device according to an embodiment of the invention.

The output driving device of FIG. 7 comprises an output circuit 50 and a leakage prevention unit 100 coupled to the output circuit 50.

The output circuit 50 performs a data output drive operation by receiving a supply of power and thus maintains an output terminal OUT at a low impedance state in the output drive operation, and maintains the output terminal OUT at a high impedance state by receiving the supply of power in a non-output drive operation.

The leakage prevention unit 100 is coupled to the output terminal OUT of the output circuit 50, and prevents an inflow of current to the output circuit 50 through the output terminal OUT when the supply of power is not supplied to the output circuit 50.

Figure 8:
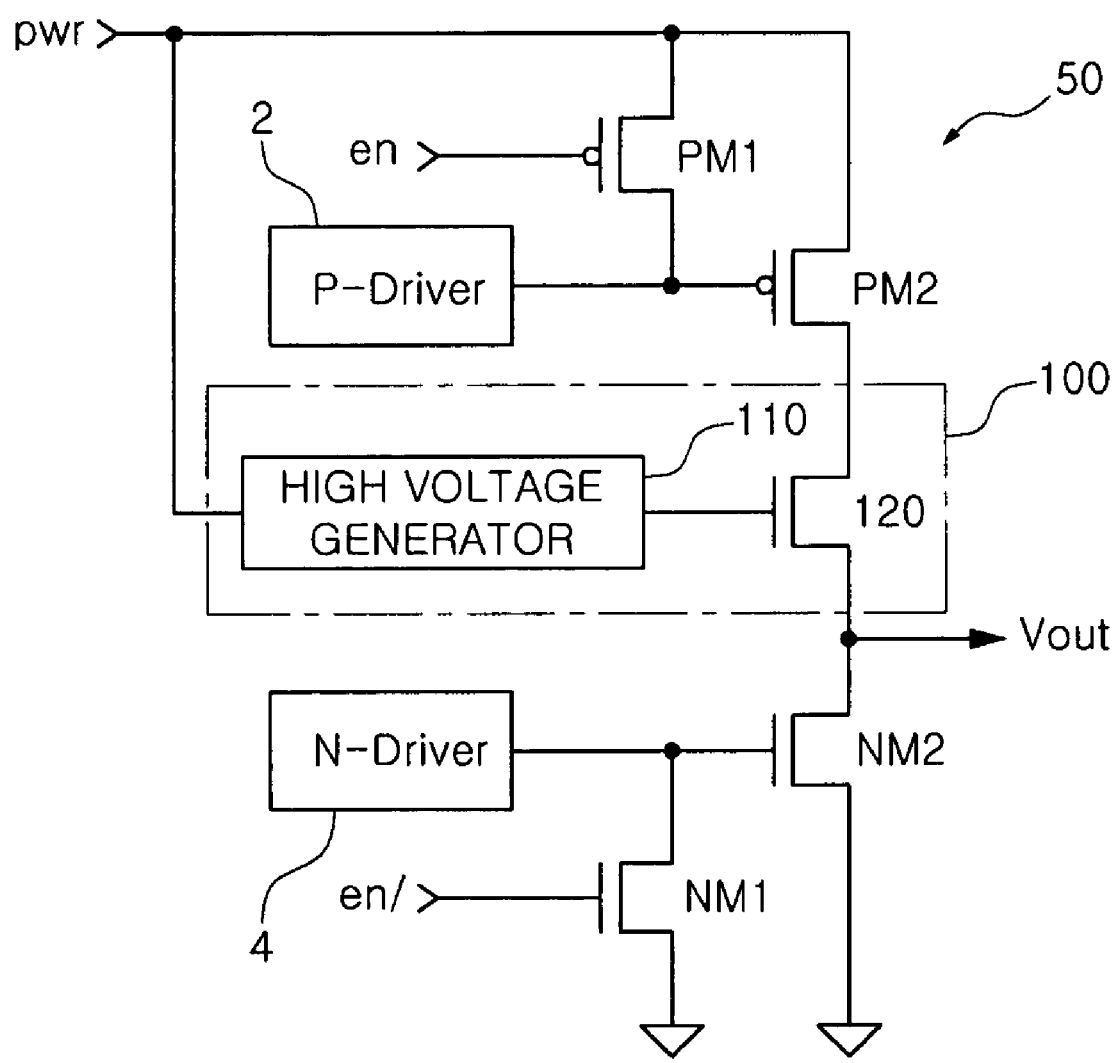
FIG. 8 is a circuit diagram of the output driving device illustrated in the embodiment of FIG. 7.

FIG. 8 is a detailed circuit diagram of the output driving device illustrated in the embodiment of FIG. 7.

In FIG. 8, the output circuit 50 comprises a PMOS (first conductive) transistor PM2 functioning as a pull-up transistor and an NMOS (second conductive) transistor NM2 as a pull-down transistor.

The PMOS transistor PM2 receives a supply of power (pwr) applied to a source terminal thereof, and provides or intercepts the supply of power (pwr) from the source terminal to an output terminal Vout coupled to a drain terminal of the PMOS transistor PM2, in accordance with a logic state of a gate terminal of the PMOS transistor PM2. In an embodiment, the PMOS transistor PM2 intercepts the supply of power (pwr) in an output drive operation, and maintains the gate terminal at a level of the supply of power in the non-output drive operation.

The NMOS transistor NM2 comprises a drain terminal that is coupled to the output terminal Vout coupled to the drain terminal of the PMOS transistor PM2, and a source terminal of the NMOS transistor NM2 is coupled to ground. In the output drive operation, a voltage level of the drain terminal is maintained or is changed to a ground voltage level depending on a logic state of the gate terminal of the NMOS transistor NM2, and in the non-output drive operation, the gate terminal is maintained at the ground voltage level.

The leakage prevention unit 100 comprises a switching transistor 120 and a high voltage generator 110. The switching transistor 120 is coupled between the drain terminal of the PMOS transistor PM2 and the output terminal Vout, and transfers a drain output voltage of the PMOS transistor PM2 to the output terminal Vout without a level change in the output drive operation, and prevents an external current from flowing into the drain terminal of the PMOS transistor PM2 when the supply of power (pwr) is not supplied to the output circuit, even though the external current may possibly flow through the output terminal Vout. The high voltage generator 110 applies a high voltage having a level higher than a voltage level of the supply of power (pwr) to the gate terminal of the switching transistor 120 in the output drive operation, and applies a voltage to completely turn off the switching transistor 120 to gate terminal of the switching transistor 120 when the supply of power (pwr) is not supplied to the output circuit.

In FIG. 8, pull-up driver 2 is coupled to gate terminal of the PMOS transistor PM2 and outputs data of a logic high or logic low level. Further, pull-down driver 4 is coupled to gate terminal of the NMOS transistor NM2 and outputs data of a logic high or logic low level.

In the non-output drive operation, PMOS transistor PM1 is turned on in response to an enable signal (en) applied at a logic low level to PMOS transistor PM1. Then, the pull-up driver 2 is disabled.

Furthermore, in the non-output drive operation, NMOS transistor NM1 is turned on in response to an enable bar signal (en/) applied at a logic high level to NMOS transistor NM1. Thus, the pull-down driver 4 is disabled.

When a supply of power (pwr) is applied in the non-output drive operation, the output terminal Vout is at a high impedance state by a turn-on operation of the PMOS and NMOS transistors PM1 and NM1.

An NMOS transistor 120 functioning as a switching transistor transfers a drain output voltage of the PMOS transistor PM2 to the output terminal Vout without a level change in the output drive operation, that is, performs a function such as an electrical connection wiring.

On the other hand, the NMOS transistor 120 prevents an external current from being applied to a drain terminal of the PMOS transistor PM2 when the supply of power (pwr) is not supplied to the output circuit, an inflow of the external current being causable through the output terminal Vout. When the supply of power is not supplied, the gate terminal of the NMOS transistor 120 becomes a ground voltage level, and the source terminal becomes a positive voltage level, for example, +3V, etc., when being driven by an external device, thereby sufficiently satisfying a turn-off condition as '$V_{GS}$ (voltage between gate and source)−Vth(threshold voltage)' becomes below 0V.

As a result, the NMOS transistor 120 functions as a unidirectional switch. Accordingly, a current path such as that described above with reference to FIG. 6 is not formed in the circuit illustrated in FIG. 8.

Figure 9:
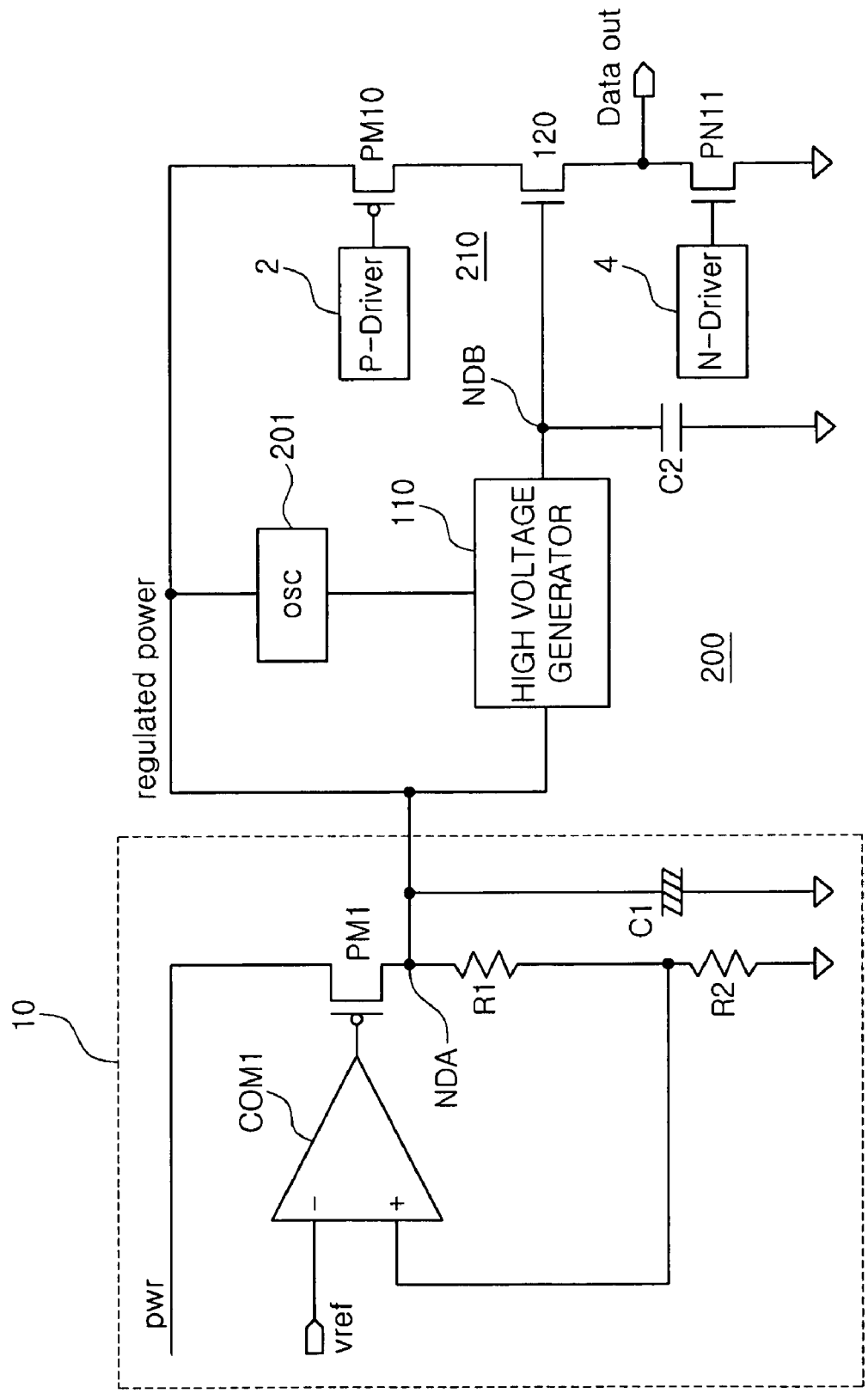
FIG. 9 is a circuit diagram of an output driving device receiving a supply voltage from a regulator, according to an embodiment of the invention.

FIG. 9 is a circuit diagram of an output driving device receiving a supply voltage from a regulator, according to an embodiment of the invention. Specifically, FIG. 9 illustrates that a constant voltage output from a regulator 10 is used to provide a supply voltage (pwr) to an output driving device, such as the output driving device shown in FIGS. 7 and 8.

In FIG. 9, the regulator 10 comprises a comparator COM1, drive transistor PM1, voltage divider resistors R1 and R2, and capacitor C1. In adapting the high voltage generator 110 as a step-up converter using a voltage doubler etc., an oscillator 201 is employed. The high voltage generator 110 converts a regulated-input voltage applied to an input node NDA to a high voltage that is twice that of the regulated-input voltage, and provides the high voltage to an output node NDB.

A reason for increasing a level of the output node NDB to a level two times that of the supply of power (pwr) is to substantially reduce a voltage drop caused by a turn-on resistance by the switching transistor 120 in order to permit the switching transistor 120 to become conductive. Accordingly, the switching transistor 120 serves as a power wiring in a turn-on operation. When it is difficult to design a sufficient internal voltage characteristic between the drain and source of the switching transistor 120, an input voltage of the high voltage generator 110 may be selected as a relatively low level of voltage. Its modification is described as follows, referring to FIG. 10.

Figure 10:
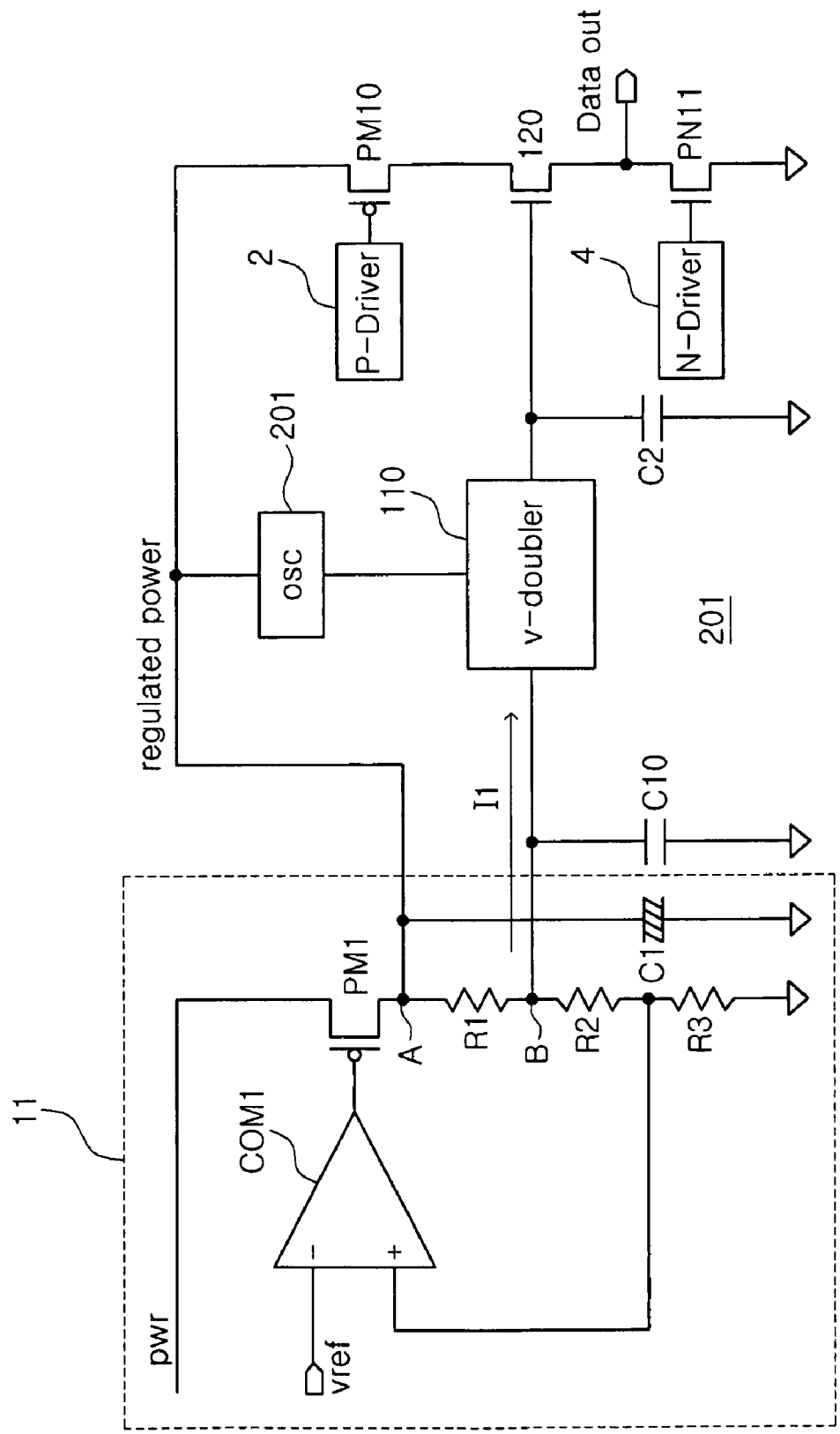
FIG. 10 is a circuit diagram of an output driving device according to a modified embodiment of FIG. 9.

FIG. 10 is another circuit diagram according to a modified embodiment of FIG. 9.

With reference to FIG. 10, an input voltage of a voltage doubler 110 functioning as a high voltage generator is provided from a resistance distribution node B of a regulator 11. In this case, the supply of power used by the oscillator 201 and a PMOS transistor PM10 is provided from a resistance distribution node A.

FIG. 10 provides a circuit adapted by considering a difficulty to drive the switching transistor 120 with twice an output voltage of regulator 11 because of a relatively low internal voltage characteristic of the switching transistor 120. In this case, the input voltage of the voltage doubler 110 is obtained from node B having a voltage lower than a voltage of resistance distribution node A, not resistance distribution node A of the regulator 11.

Here, the resistance distribution node B must be decided so that two times a voltage appearing in the resistance distribution node B does not exceed an internal voltage of the switching transistor 120 and an on-resistance of the switching transistor 120 becomes sufficiently small.

An amount of current I1 applied to the voltage doubler 110 need not be large since the voltage doubler 110 just has to drive a gate of the switching transistor 120.

Further, in FIG. 10, an output-terminal inflow current blocking scheme in a data output driving device having pull-up and pull-down transistors whose channels are coupled to each other in series may be realized by installing an NMOS transistor 120 as unidirectional switching device between the pull-up transistor PM10 and the output terminal (Data out).

That is, when data output driving device of FIG. 10 is in an operating mode, the unidirectional switching device is maintained in a switched on-state without an electrical loss, and when the supply of power is not applied to the data output driving device, the unidirectional switching device is maintained in an off-state. That is, when the supply of power is not applied, an electrical signal, which may flow into the interior through the output terminal, is fundamentally intercepted.

A detailed application of circuit like in FIG. 10 may be provided to an output driving device with a USB system of an electronic processing device such as computers, HHP, and the like. The output driving device of USB system comprises a regulator in the inside thereof to keep an output high value of 3.3 V. For an expected case where an output terminal is driven through other bus schemes externally, some measurements to block a leakage current must be arranged. For example, when there is no power input of 5 V and even when an output terminal is driven by an electrical signal of 3.6 V, an internal circuit of the output driving device must not be electrically influenced or the device should not experience one or more of the abovementioned problems associated with a leakage current path.

As described above, according to some embodiments of the invention, even when power is not supplied to the device, the output terminal is maintained at a high impedance state. Therefore, even though the output terminal is driven by other external devices, a leakage current path is not formed inside the device.

It will be apparent to those skilled in the art that modifications and variations can be made in the present invention without deviating from the inventive spirit or scope. Thus, it is intended that the present invention cover any such modifications and variations of this invention provided they come within the scope of the appended claims and their equivalents.

For example, in other cases, component devices of leakage prevention unit may be comprised of other switching devices in place of MOS transistors without deviating from the inventive spirit. Additionally, an electronic processing device may be personal computers, notebook computers, portable electronic devices such as HHP or PMP (Portable Multimedia Player) etc., and a semiconductor memory device may be NVM (Non-volatile Memory) such as flash memory, DRAM, SRAM etc. Accordingly, these and other changes and modifications are seen to be within the inventive true spirit and scope as defined by the appended claims.

In the drawings and specification, there have been disclosed embodiments of the invention and, although specific terms are employed, they are used in a generic and descriptive sense only and not for limitation. While the inventive concepts have been particularly shown and described with reference to exemplary embodiments, it will be understood that various changes in form and details may be made therein without departing from the spirit and scope of the invention, as described by the following claims.

What is claimed is:

1. An output driving device comprising:
   an output circuit that maintains an output terminal at a low impedance state by receiving a supply of power in an output drive operation and that maintains the output terminal at a high impedance state by receiving the supply of power in a non-output drive operation; and
   a leakage prevention unit coupled to the output terminal of the output circuit,
   wherein the leakage prevention unit is configured to prevent a current inflow to the output circuit through the output terminal in response to the supply of power not being supplied to the output circuit and the leakage prevention unit.

2. The device of claim 1, wherein the output circuit comprises:
   a first conductive Metal Oxide Semiconductor (MOS) transistor comprising a source terminal, a drain terminal coupled to the output terminal, and a gate terminal, wherein the MOS transistor provides or cuts off the supply of power that is applied to the source terminal to the output terminal according to a logic state of the gate terminal in the output drive operation, and maintains the gate terminal at a level of the supply of power in the non-output drive operation; and
   a second conductive MOS transistor comprising a source terminal, a drain terminal, and a gate terminal, wherein the drain terminal is coupled to the output terminal, wherein the source terminal is coupled to a ground voltage, wherein a voltage level of the drain terminal is maintained intact or changed to a level of the ground voltage according to a logic state of the gate terminal in the output drive operation, and wherein the gate terminal is maintained at a level of the ground voltage in the non-output drive operation.

3. The device of claim 2, wherein the leakage prevention unit comprises a switching transistor that is coupled between the drain terminal of the first conductive MOS transistor and the output terminal, that transfers a drain output voltage of the first conductive MOS transistor to the output terminal without a level change in the output drive operation, and that prevents an external current from being applied to the drain terminal of the first conductive MOS transistor through the output terminal when the supply of power is not supplied to the output circuit.

4. The device of claim 3, further comprising a high voltage generator that applies a voltage having a level that is higher than a voltage level of the supply of power to a gate terminal of the switching transistor in the output drive operation, and that applies a voltage to completely turn off the switching transistor to the gate terminal of the switching transistor when the supply voltage is not supplied to the output circuit.

5. The device of claim 3, wherein the switching transistor comprises an n-type MOS transistor.

6. The device of claim 5, wherein the output driving device is applied to a universal serial bus (USB) system.

7. The device of claim 2, wherein when the first conductive MOS transistor is a p-type MOS transistor, the second conductive MOS transistor is an n-type MOS transistor.

8. A data output driving device including an output circuit having pull-up and pull-down transistors comprising channels that are coupled in series to each other, the device comprising:
   a regulator that receives an operating power and generates a regulated voltage as a supply of power;
   a pull-up driver coupled to a gate terminal of the pull-up transistor;
   a pull-down driver coupled to a gate terminal of the pull-down transistor;
   a high voltage generator that receives the supply of power and generates a high voltage having a level that is higher than that of the supply of power; and
   a switching transistor to connect a pull-up voltage appearing in a drain terminal of the pull-up transistor to an output terminal without a voltage drop in response to the high voltage, and to block an inflow of an external electrical signal to the pull-up transistor when the external electrical signal is applied to the output terminal,
   wherein the high voltage generator applies a voltage lower than twice that of the supply of power to the gate terminal of the switching transistor when the supply power exists, and applies a ground voltage to the gate terminal when the supply of power does not exist.

9. The device of claim 8, wherein the data output driving device is an output driving device of a USB system.

10. A method of blocking an inflow of current into an output terminal in a data output driving device including pull-up and pull-down transistors having channels that are coupled in series to each other, the method comprising:
    installing a unidirectional switching device between the pull-up transistor and the output terminal; and
    maintaining the unidirectional switching device at a switching-on state without a loss of electricity when the data output driving device is in an operating mode, and maintaining the unidirectional switching device at a switching off state when a supply of power is not applied to the data output driving device, so as to block an electrical signal from flowing into an interior of the device from the output terminal.

11. The method of claim 10, wherein the unidirectional switching device is constructed of an n-type MOS transistor having an operation of compensating for a threshold voltage drop.

* * * * *